(12) United States Patent
Mun et al.

(10) Patent No.: US 8,914,572 B2
(45) Date of Patent: Dec. 16, 2014

(54) MEMORY CONTROLLERS AND MEMORY SYSTEMS INCLUDING THE SAME

(75) Inventors: Kui-Yon Mun, Hwaseong-si (KR); Hwa Seok Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 13/542,901

(22) Filed: Jul. 6, 2012

(65) Prior Publication Data

US 2013/0013855 A1    Jan. 10, 2013

(30) Foreign Application Priority Data

Jul. 8, 2011    (KR) .......................... 10-2011-0068083

(51) Int. Cl.
| | |
|---|---|
| G06F 12/00 | (2006.01) |
| G06F 12/14 | (2006.01) |
| G06F 13/16 | (2006.01) |
| G11C 16/00 | (2006.01) |

(52) U.S. Cl.
CPC ............ *G11C 16/00* (2013.01); *G06F 12/1408* (2013.01); *G06F 13/16* (2013.01); *G06F 12/1425* (2013.01); *G06F 12/14* (2013.01)
USPC ............ 711/103; 711/156; 711/163; 711/170

(58) Field of Classification Search
CPC .. G06F 12/14; G06F 12/1408; G06F 12/1425
USPC ....................................... 711/103
See application file for complete search history.

(56) References Cited

U.S. PATENT DOCUMENTS

| | | | |
|---|---|---|---|
| 5,931,968 A | 8/1999 | Gray | |
| 7,310,347 B2 | 12/2007 | Lasser | |
| 8,370,561 B2* | 2/2013 | Sharon et al. | ................. 711/103 |
| 2008/0010331 A1* | 1/2008 | Janke et al. | ................... 708/250 |
| 2008/0082736 A1* | 4/2008 | Chow et al. | .................... 711/103 |
| 2008/0133929 A1* | 6/2008 | Gehrmann et al. | ........... 713/179 |
| 2010/0039860 A1 | 2/2010 | Ruby et al. | |
| 2011/0119432 A1* | 5/2011 | Yoon | ............................ 711/103 |

FOREIGN PATENT DOCUMENTS

WO    WO 2006/033099    3/2006

* cited by examiner

*Primary Examiner* — April Y Blair
*Assistant Examiner* — Prasith Thammavong
(74) *Attorney, Agent, or Firm* — Myers Bigel Sibley & Sajovec, PA

(57) ABSTRACT

A memory controller may include a cell state generator that is configured to generate a cell state for each of a plurality of multi-level cells included in a non-volatile memory device, using data of pages. The memory controller may also include a pseudo-random number generator that is configured to generate a pseudo-random number. The memory controller may further include an operator that is configured to change the cell state of each multi-level cell using the pseudo-random number, and that is configured to output a changed cell state for each multi-level cell.

20 Claims, 11 Drawing Sheets

(a)

| OCS(Pj) / PRN(Hi) | P0 | P1 | P2 | P3 |
|---|---|---|---|---|
| H0 | P0 | P1 | P2 | P3 |
| H1 | P3 | P0 | P1 | P2 |
| H2 | P2 | P3 | P0 | P1 |
| H3 | P1 | P2 | P3 | P0 |

CPj (b)

MEMORY CONTROLLERS AND MEMORY SYSTEMS INCLUDING THE SAME

CROSS-REFERENCE TO RELATED APPLICATIONS

This U.S. non-provisional patent application claims priority under 35 U.S.C. §119(a) from Korean Patent Application No. 10-2011-0068083, filed on Jul. 8, 2011, the disclosure of which is hereby incorporated by reference in its entirety.

BACKGROUND

The present disclosure relates to the field of electronics, and more particularly, to memory controllers.

Non-volatile memory devices can retain data therein even if their power supply is interrupted. For instance, flash memory devices are electrically programmable erasable non-volatile memory devices. Examples of flash memory devices include NAND flash memory devices and NOR flash memory devices.

Moreover, methods of randomizing data of pages using a linear feedback shift register (LFSR) have been used for cells to which data is programmed in a non-volatile memory device.

SUMMARY

According to various embodiments, a memory controller may include a cell state generator that is configured to generate a cell state for each of a plurality of multi-level cells included in a non-volatile memory device, using data of pages. The memory controller may also include a pseudo-random number generator that is configured to generate a pseudo-random number. The memory controller may further include an operator that is configured to change the cell state of each multi-level cell using the pseudo-random number, and that is configured to output a changed cell state for each multi-level cell.

In various embodiments, the operator may change the cell state of each multi-level cell using a hash function.

According to various embodiments, the pseudo-random number may be used as a first key value of the hash function and the cell state of each multi-level cell may be used as a second key value of the hash function.

In various embodiments, the hash function may be stored in a read-only memory included in the memory controller.

According to various embodiments, the memory controller may transmit data of pages that corresponds to the changed cell state to the non-volatile memory device.

In various embodiments, a memory system may include a non-volatile memory device including a plurality of multi-level cells. The memory system may also include a memory controller configured to control an operation of the non-volatile memory device. The memory controller may include a cell state generator configured to generate a cell state of each of the multi-level cells included in the non-volatile memory device using data of pages, a pseudo-random number generator configured to generate a pseudo-random number, and an operator configured to change the cell state of each multi-level cell using the pseudo-random number and to output a changed cell state for each multi-level cell.

According to various embodiments, data of pages that corresponds to the changed cell state may be stored in the non-volatile memory device. Moreover, the data of pages may be written to a single word line in the non-volatile memory device.

In various embodiments, the memory system may be a multi-chip package including the non-volatile memory device and the memory controller.

According to various embodiments, a memory card may include a card interface configured to communicate with a host. The memory card may also include a memory controller connected between the card interface and a non-volatile memory device including a plurality of multi-level cells.

In various embodiments, the memory card may be one of a multimedia card (MMC), a secure digital (SD) card, and a universal serial bus (USB) flash drive.

According to various embodiments, a portable communication system may include a memory controller configured to control an operation of a non-volatile memory device. The portable communication system may also include a display configured to display data output from the non-volatile memory device under the control of the memory controller.

In various embodiments, a solid state drive may include a memory controller configured to control a data processing operation of each of a plurality of non-volatile memory devices. The solid state drive may also include a buffer manager configured to control data transmitted between the memory controller and a host to be stored in a volatile memory device.

According to various embodiments, a memory controller may include a cell state generator configured to use page data to generate multi-bit cell states for respective multi-level cells that are in a non-volatile memory device. The memory controller may also include a pseudo-random number generator configured to generate a multi-bit pseudo-random number. The memory controller may further include an operator including inputs connected to the cell state generator and the pseudo-random number generator, respectively. The operator may be configured to use the multi-bit pseudo-random number to change the multi-bit cell states for the multi-level cells. The operator may be further configured to output changed cell states for the multi-level cells to the non-volatile memory device.

In various embodiments, the operator may be configured to use a hash function to change the multi-bit cell states. Additionally, the operator may use the hash function to perform a logic operation on the multi-bit cell states using the multi-bit pseudo-random number to change the cell states to the changed cell states.

According to various embodiments, the page data may include data received from a host that is connected to the memory controller, and the memory controller may be configured to connect the host to the non-volatile memory device.

BRIEF DESCRIPTION OF THE DRAWINGS

The above and other features and advantages of the disclosure will become more apparent in view of the attached drawings and accompanying detailed description.

DETAILED DESCRIPTION

Figure 1:
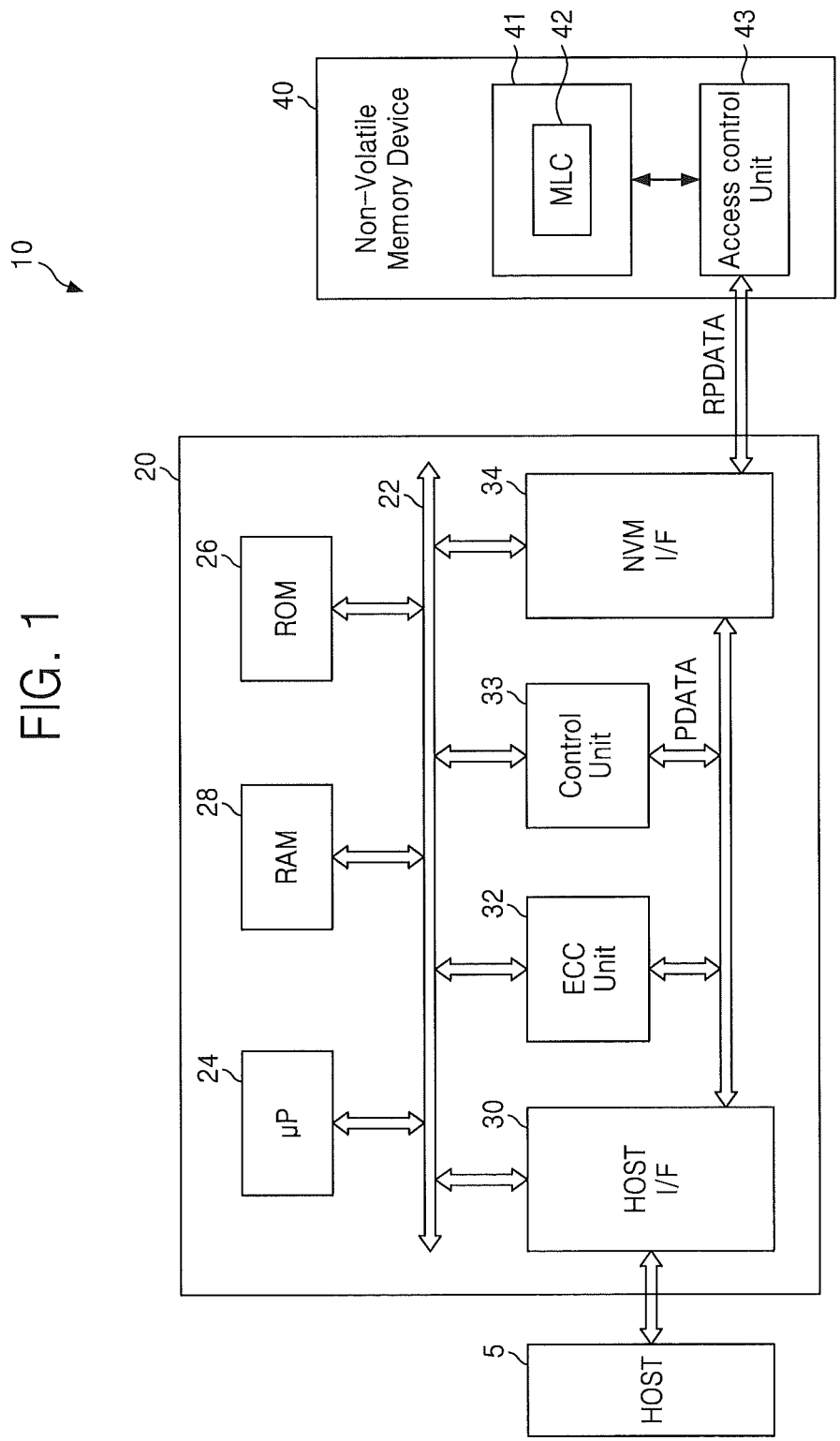
FIG. 1 is a block diagram of a memory system according to various embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory system 10 according to various embodiments of the present disclosure. Referring to FIG. 1, the memory system 10 includes a memory controller 20 and a non-volatile memory device 40. The memory system 10 may also include a host or processor 5.

The memory system 10 may be for/within a personal computer (PC), a portable computer, a cellular phone, a smart phone, a tablet PC, a personal digital assistant (PDA), a portable multimedia player (PMP), a global positioning system (GPS) navigation system (e.g., an automotive navigation system), an MP3 player, audio equipment, a television (TV), a digital camera, or a camcorder, among other electronic devices.

In various embodiments, the memory controller 20 and the non-volatile memory device 40 may be implemented in a single package, e.g., a multi-chip package. Although only one non-volatile memory device 40 is illustrated in FIG. 1, the memory controller 20 may control the operations of a plurality of non-volatile memory devices.

The memory controller 20 may control data processing operations, such as program operations, read operations, and erase operations, of the non-volatile memory device 40 under the control of the host 5.

The memory controller 20 includes a microprocessor 24, a read-only memory (ROM) 26, a random access memory (RAM) 28, a host interface (I/F) 30, an error correction code (ECC) unit 32, a control unit 33, and a non-volatile memory interface (NVM I/F) 34. In various embodiments, a buffer may be provided between the host interface 30 and the non-volatile memory interface 34. The buffer may be a page buffer and may temporarily store data transmitted between the host 5 and the non-volatile memory device 40.

The microprocessor 24, the ROM 26, the RAM 28, the host interface 30, the ECC unit 32, the control unit 33, and the non-volatile memory interface 34 are connected and communicate data with one another via a bus 22.

The microprocessor 24 may execute a program stored in the ROM 26. (And the ROM 26 may store a program executed by the microprocessor 24.) As an example, the ROM 26 may store a program that can control or manage the host interface 30, the ECC unit 32, or the non-volatile memory interface 34. For example, a hash function H(x,y) may be stored in the ROM 26 included in the memory controller 20. Additionally, the RAM 28 may temporarily store a program executed by the microprocessor 24. Moreover, the program stored in the ROM 26 may be loaded to the RAM 28 under control of the microprocessor 24.

The host interface 30 provides an interface for communication between the host 5 and the microprocessor 24. Additionally, the host interface 30 may be under the control of the microprocessor 24. The host interface 30 may include an advanced technology attachment (ATA) interface, a serial ATA (SATA) interface, a parallel ATA (PATA) interface, or a small computer system interface (SCSI).

The ECC unit 32 may generate an ECC from write data that is output from the host 5, add the ECC to the write data, and write the write data and the ECC together as data to a page in the non-volatile memory device 40.

The ECC unit 32 may be implemented as a processing module configured to execute a program stored in the ROM 26 or the RAM 28, under the control of the microprocessor 24.

The non-volatile memory device 40 may include a memory cell array 41 and an access control unit 43 that may access the memory cell array 41. The memory cell array 41 may include a plurality of memory cells (e.g., multi-level cells (MLCs) 42), each of which can store one bit or more. The access control unit 43 controls the non-volatile memory device 40 to perform a program operation, read operation, or erase operation in response to control signals received from the memory controller 20.

Figure 2:
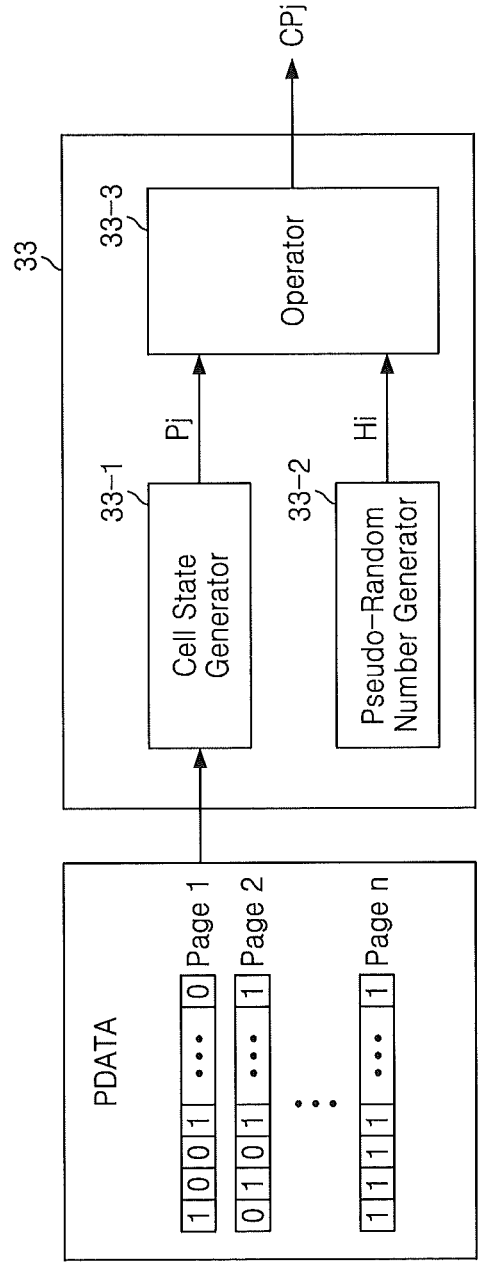
FIG. 2 is a block diagram of the control unit illustrated in FIG. 1 according to various embodiments.

FIG. 2 is a block diagram of the control unit 33 illustrated in FIG. 1 according to various embodiments. The control unit 33 may include a cell state generator 33-1, a pseudo-random number generator 33-2, and an operator (e.g., a controller or operator circuit) 33-3.

The cell state generator 33-1 generates a cell state Pj for each of the MLCs 42 in the non-volatile memory device 40 based on data PDATA of pages. The data PDATA of pages is transmitted from the host interface 30 to the cell state generator 33-1. The data PDATA may be write data that is received from the host 5 in units of pages.

The data PDATA of pages is programmed into the non-volatile memory device 40 in units of pages. The data PDATA of multiple pages (e.g., a second page when an MLC is a 2-bit MLC and a third page when an MLC is a 3-bit MLC) may be programmed together into a single MLC.

In generating the cell state Pj of a 2-bit MLC, the cell state generator 33-1 extracts a value of a first bit in first page data corresponding to a lower page among the received page data PDATA and a value of a first bit in second page data corresponding to an upper page among the received page data PDATA. When the extracted values are "1" and "1", the cell state generator 33-1 outputs a "11" state (i.e., a first state).

Additionally, the cell state generator 33-1 extracts a value of a second bit in the first page data corresponding to the lower page among the received page data PDATA and a value of a second bit in the second page data corresponding to the upper page among the received page data PDATA. When the extracted values are "0" and "1", the cell state generator 33-1 outputs a "10" state (i.e., a second state).

The pseudo-random number generator 33-2 generates a random (or pseudo-random) number. For example, the pseudo-random number generator 33-2 may generate an N-bit pseudo-random number Hi. Although various embodiments herein provide examples in which a 2-bit or 3-bit pseudo-random number Hi is generated, the inventive concept is not restricted to two or three bits, but rather may be embodied by four or more bits according to various embodiments.

The operator 33-3 uses a hash function to perform a logic operation on the cell state Pj of each of the MLCs 42 using the pseudo-random number Hi to change the cell state Pj of each MLC 42. The operator 33-3 then outputs a changed cell state CPj.

The pseudo-random number Hi is used as a first key value of the hash function, and the cell state Pj of each MLC 42 is used as a second key value of the hash function.

Figure 3:
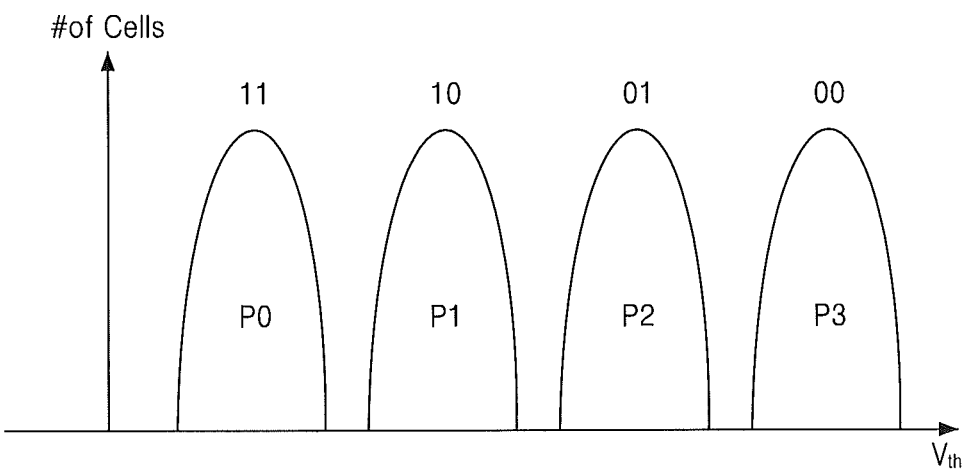
FIG. 3(a) is a diagram illustrating relationships between threshold voltages and cell states according to various embodiments.
FIG. 3(b) is a chart illustrating cell states that are changed using a hash function according to various embodiments.

FIG. 3(a) is a diagram illustrating relationships between threshold voltages Vth and cell states P0, P1, P2 and P3, according to various embodiments. FIG. 3(b) is a chart illustrating cell states that have been changed using a hash function, according to various embodiments. Although the pseudo-random number Hi and the cell state Pj are illustrated as having two bits in length in FIGS. 3(a) and 3(b), the present disclosure is not restricted to two bits, but rather may be embodied by three or more bits according to various embodiments.

In FIG. 3(a), the horizontal axis indicates the threshold voltage Vth and the vertical axis indicates the number of memory cells. Moreover, in FIG. 3(a), a first state P0 corresponding to an erased state indicates "11"; and second, third, and fourth states P1, P2, and P3 corresponding to programmed states indicate "10", "01", and "00", respectively.

In FIG. 3(b), the top row of the chart illustrates original cell states (OCS) Pj (j=0, 1, 2, 3) and the leftmost column of the chart illustrates 2-bit pseudo-random numbers (PRN) Hi (i=0, 1, 2, 3).

$$CPj = H(Hi, Pj) \quad \text{(Equation 1)}$$

$$Pi = H-1(Hi, CPj) \quad \text{(Equation 2)}$$

Here, CPj (j=0, 1, 2, 3) is a cell state that has been changed using the hash function H(x, y) (where "x" is the first key value and "y" is the second key value), Hi is a pseudo-random number, and Pj is an original cell state.

For example, when the pseudo-random number (PRN) Hi is H1 and the original cell state (OCS) Pj is P1, the control unit 33 generates P0 as the changed cell state CPj using the hash function H(x, y) illustrated in Equation 1. On the other hand, a change from the changed cell state CPj to the original cell state Pj may be carried out using Equation 2. In other words, the original cell state Pj may be generated using the pseudo-random number Hi as the first key value and the changed cell state CPj as the second key value in the hash function illustrated in Equation 2.

As an example, when the pseudo-random number (PRN) Hi is H1 and the changed cell state CPj is P0, the control unit 33 generates P1 as the original cell state (OCS) Pj using the hash function illustrated in Equation 2.

Figure 4:
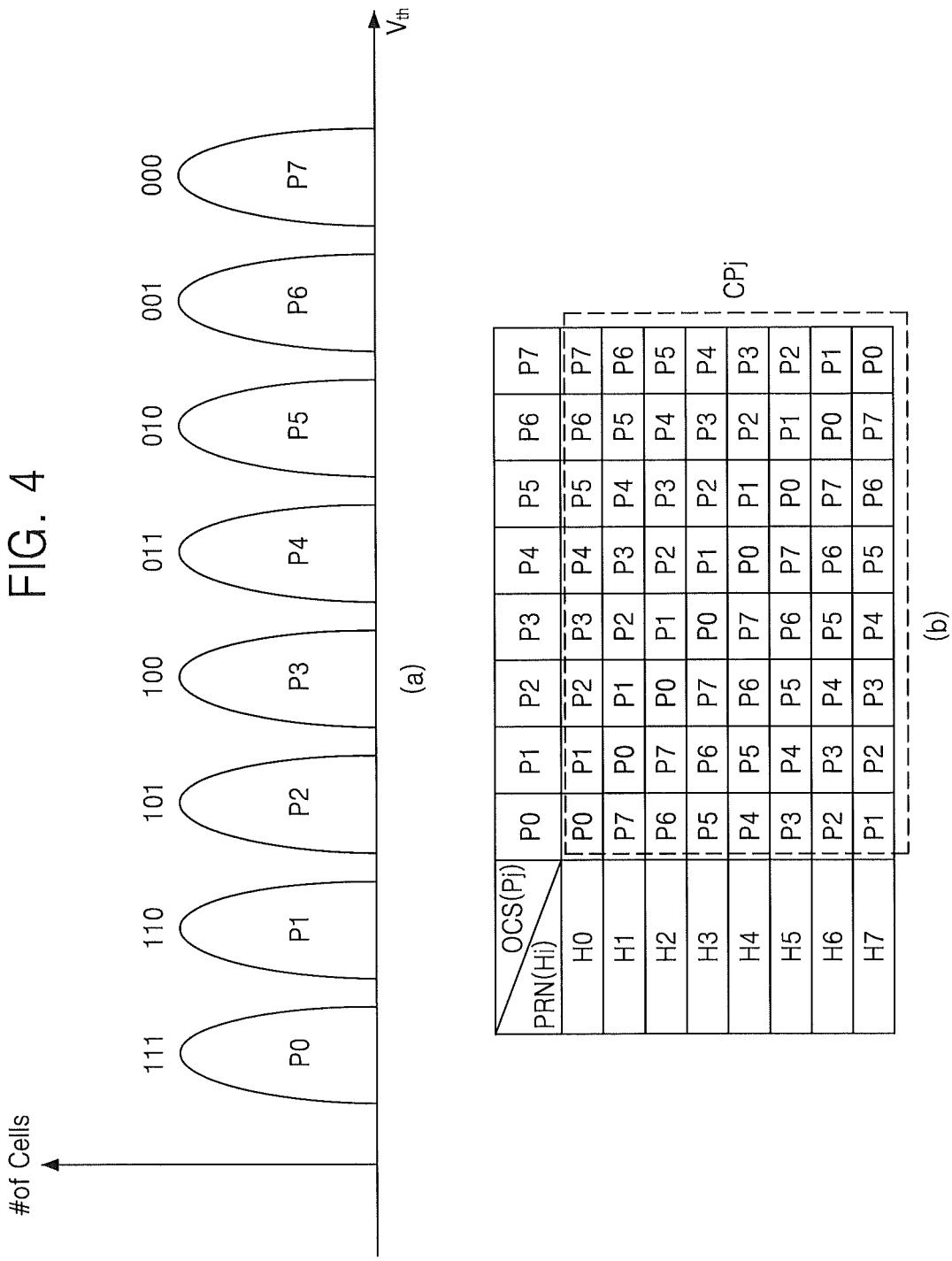
FIG. 4(a) is a diagram illustrating relationships between threshold voltages and cell states according to various embodiments.
FIG. 4(b) is a chart illustrating cell states that are changed using a hash function according to various embodiments.

FIG. 4(a) is a diagram illustrating relationships between threshold voltages Vth and cell states P0 to P7, according to various embodiments. FIG. 4(b) is a chart illustrating cell states that have been changed using a hash function, according to various embodiments. Although the pseudo-random number Hi and the cell state Pj are indicated as having three bits in length in FIGS. 4(a) and 4(b), the present disclosure is not restricted to three bits, but rather may be embodied by two bits or by four or more bits.

In FIG. 4(a), the horizontal axis indicates the threshold voltage Vth and the vertical axis indicates the number of memory cells. Moreover, in FIG. 4(a), a first state P0 corresponding to an erased state indicates "111"; and second through eighth states P1 through P7 corresponding to programmed states indicate "110", "101", "100", "011", "010", "001", and "000", respectively.

In FIG. 4(b), the top row of the chart illustrates original cell states (OCS) Pj (j=0~7) and the leftmost column of the chart illustrates 3-bit pseudo-random numbers (PRN) Hi (i=0~7). As illustrated by FIGS. 4(a) and 4(b), the changed cell state CPj is generated using a similar (or the same) operation to that used in FIGS. 3(a) and 3(b), with the exception that the original cell states (OCS) Pj (j=0~7) and the pseudo-random numbers (PRN) Hi (i=0~7) have three bits in length in FIGS. 4(a) and 4(b). Thus, a repeated description of such operations may be omitted.

According to various embodiments of the present disclosure, the memory controller 20 extracts data of randomized pages using information about the changed cell state CPj output from the control unit 33, encodes the data of the randomized pages, and transmits encoded page data RPDATA to the non-volatile memory device 40 using the non-volatile memory interface 34. The encoded page data RPDATA is stored in the non-volatile memory device 40. For example, the encoded page data RPDATA may be written into/onto a single word line in the non-volatile memory device 40.

In other words, the encoded page data RPDATA is stored in a page in a memory block of the non-volatile memory device 40.

Figure 5:
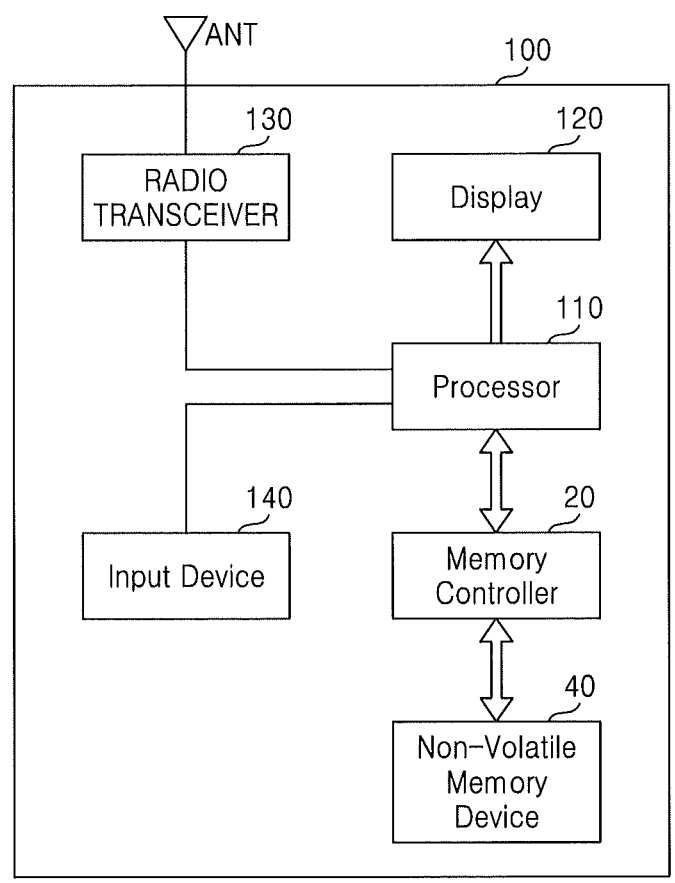
FIG. 5 is a block diagram of a memory system according to various embodiments.

FIG. 5 is a block diagram of a memory system 100 according to various embodiments. Referring to FIG. 5, the memory system 100 may be implemented for/in a cellular phone, a smart phone, a tablet personal computer, a personal digital assistant (PDA), or a radio communication system, among other electronic devices.

The memory system 100 includes a non-volatile memory device 40 and a memory controller 20 controlling operations of the non-volatile memory device 40. The memory controller 20 may control data processing operations (e.g., a program operation, an erase operation, or a read operation) of the non-volatile memory device 40, under the control of a processor 110.

Page data programmed into the non-volatile memory device 40 may be displayed through a display 120 according to the control of the processor 110 and the memory controller 20.

A radio transceiver 130 transmits and/or receives radio signals through an antenna ANT. The radio transceiver 130 may convert radio signals received through the antenna ANT into signals that can be processed by the processor 110. Accordingly, the processor 110 may process the signals from the radio transceiver 130 and transmit the processed signals to the memory controller 20 or the display 120. The memory controller 20 may program the signals processed by the processor 110 into the non-volatile memory device 40. The radio transceiver 130 may also convert signals output from the processor 110 into radio signals, and output the radio signals to an external device through the antenna ANT.

An input device 140 may enable control signals for controlling the operation of the processor 110, or data to be processed by the processor 110 to be input to the memory system 100. The input device 140 may be embodied by a pointing device such as a touch pad or a computer mouse, a keypad, or a keyboard.

The processor 110 may control the operation of the display 120 to display data output from the memory controller 20, data output from the radio transceiver 130, or data output from the input device 140. The memory controller 20, which controls the operations of the non-volatile memory device 40, may be implemented as a part of the processor 110 or as a separate chip.

Figure 6:
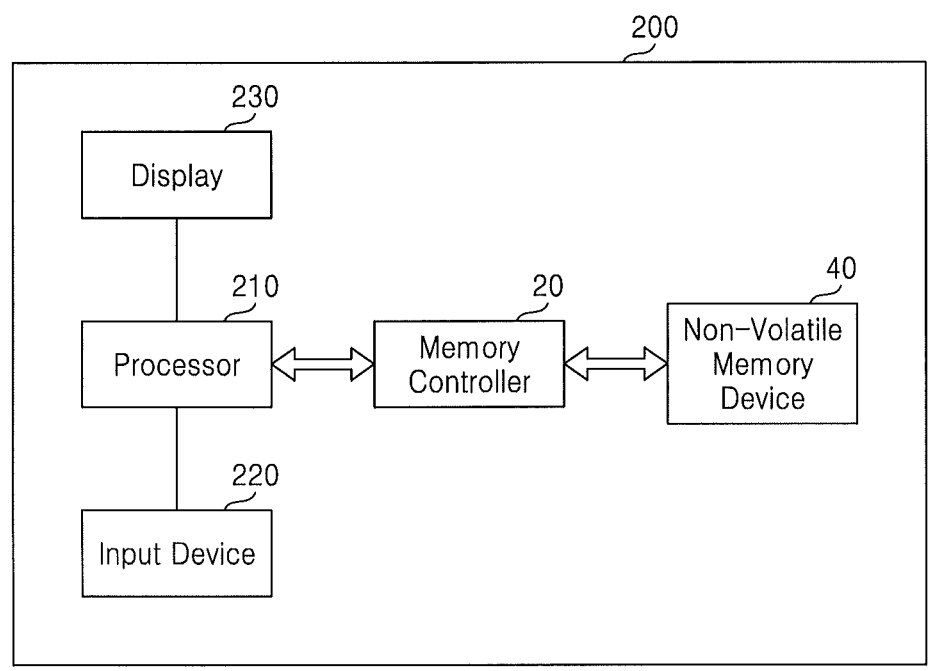
FIG. 6 is a block diagram of a memory system according to various embodiments.

FIG. 6 is a block diagram of a memory system 200 according to various embodiments. The memory system 200 may be for/within a personal computer (PC), a tablet PC, a netbook, an e-reader, a PDA, a portable multimedia player (PMP), an MP3 player, or an MP4 player, among other electronic devices.

The memory system 200 includes the non-volatile memory device 40 and the memory controller 20 controlling the data processing operations of the non-volatile memory device 40.

A processor 210 may control the display of display data stored in the non-volatile memory device 40 through a display 230 according to data input through an input device 220. The input device 220 may be embodied by a pointing device such as a touch pad or a computer mouse, a keypad, or a keyboard. The processor 210 may control the overall operation of the memory system 200 and the operation of the memory controller 20.

The memory controller 20, which may control the operations of the non-volatile memory device 40, may be implemented as a part of the processor 210 or as a separate chip.

Figure 7:
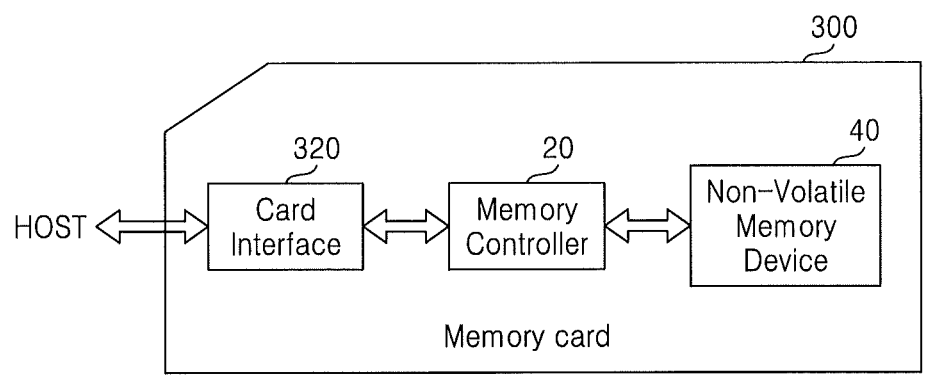
FIG. 7 is a block diagram of a memory system according to various embodiments.

FIG. 7 is a block diagram of a memory system 300 according to various embodiments. The memory system 300 may be embodied by a memory card or a smart card. The memory system 300 includes the non-volatile memory device 40, the memory controller 20, and a card interface 320.

The memory card embodying the memory system 300 may be, for example, a PC card, a multimedia card (MMC), an embedded MMC (e-MMC), a secure digital (SD) card, or a universal serial bus (USB) flash drive.

The memory controller 20 may control data exchanges between the non-volatile memory device 40 and the card interface 320. Although the card interface 320 may be an SD card interface or an MMC interface, the present disclosure is not restricted to SD and MMC interfaces, but rather may be embodied by other interfaces (e.g., a USB interface).

The card interface 320 may interface a host and the memory controller 20 for data exchanges according to a protocol of the host. For example, the card interface 320 may support a USB protocol and an interchip (IC)-USB protocol. Additionally, the card interface 320 may indicate hardware supporting a protocol used by the host, software installed in the hardware, and/or a signal transmission mode.

When the memory system 300 is connected with the host (e.g., a PC, a tablet PC, a digital camera, a digital audio player, a cellular phone, a console video game hardware, or a digital set-top box, among other electronic devices), the host may perform data communication with the non-volatile memory device 40 through the card interface 320 and the memory controller 20.

Figure 8:
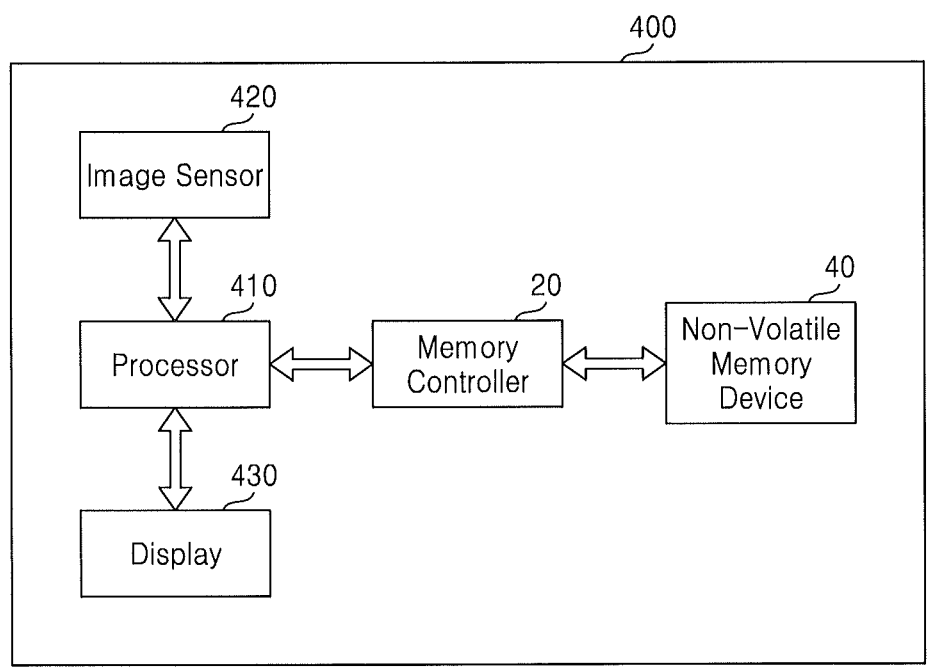
FIG. 8 is a block diagram of a memory system according to various embodiments.

FIG. 8 is a block diagram of a memory system 400 according to various embodiments. The memory system 400 may be for/within an image processor such as a digital camera or a cellular phone equipped with a digital camera.

The memory system 400 includes the non-volatile memory device 40 and the memory controller 20 controlling data processing operations (e.g., a program operation, an erase operation, and a read operation) of the non-volatile memory device 40.

An image sensor 420 may be included in the memory system 400, and may convert optical images into digital signals and output the digital signals to a processor 410 or the memory controller 20. The digital signals may be controlled by the processor 410 to be displayed through a display 430 or stored in the non-volatile memory device 40 through the memory controller 20.

Data stored in the non-volatile memory device 40 may be displayed through the display 430 according to the control of the processor 410 or the memory controller 20. The memory controller 20, which may control the operations of the non-volatile memory device 40, may be implemented as a part of the processor 410 or as a separate chip.

Figure 9:
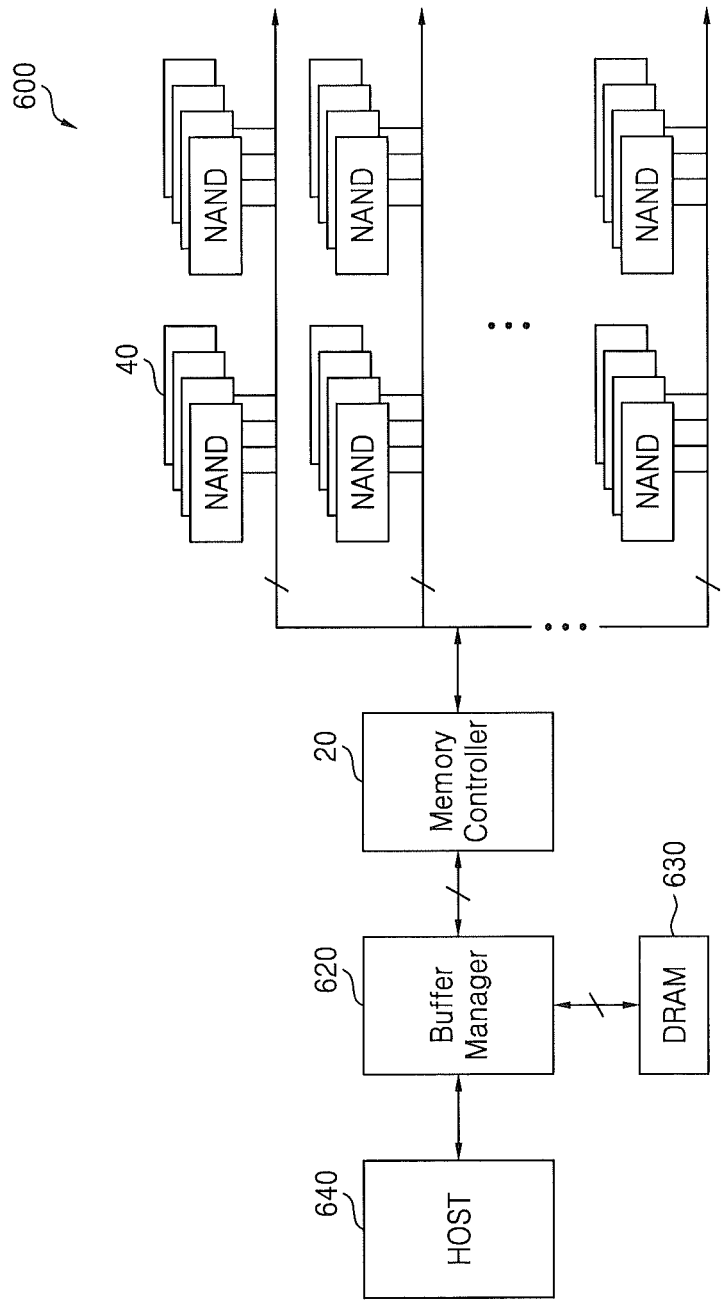
FIG. 9 is a block diagram of a memory system according to various embodiments.

FIG. 9 is a block diagram of a memory system 600 according to various embodiments. The memory system 600 may be for/within a data storage system such as a solid state drive (SSD). The memory system 600 includes a plurality of non-volatile memory devices 40 (e.g., NAND memory devices), the memory controller 20 controlling data processing operations of the non-volatile memory devices 40, a volatile memory device 630 (e.g., a dynamic random access memory (DRAM)), and a buffer manager 620 controlling data that is transferred between the memory controller 20 and a host 640 (and that is to be stored in the volatile memory device 630).

Figure 10:
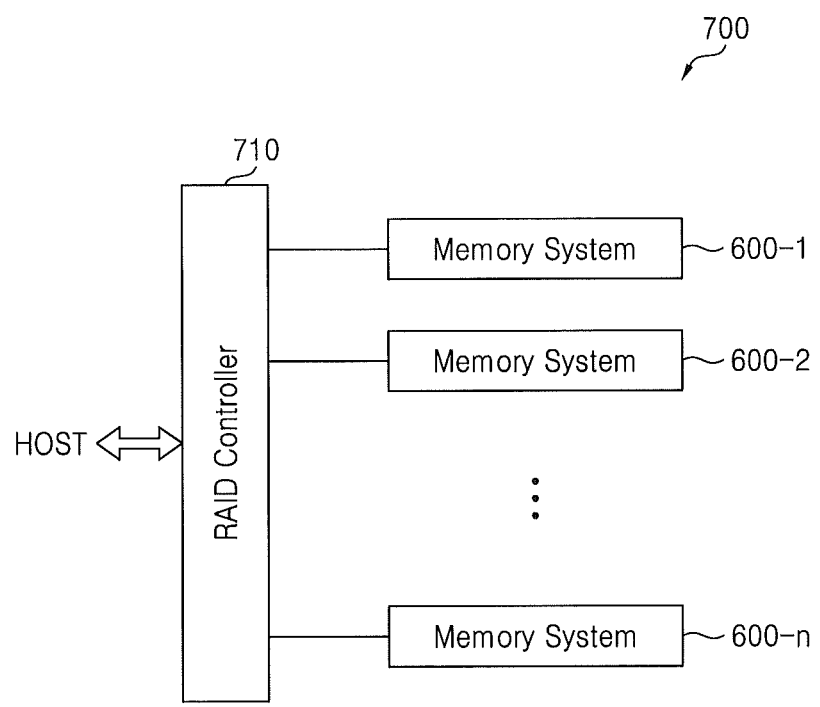
FIG. 10 is a block diagram of a data processing system that includes the memory system illustrated in FIG. 9 according to various embodiments.

FIG. 10 is a block diagram of a data processing system 700 including the memory system 600 illustrated in FIG. 9 according to various embodiments. Referring to FIGS. 9 and 10, the data processing system 700 may be implemented as a redundant array of independent disks (RAID) system. The data processing system 700 includes a RAID controller 710 and a plurality of memory systems 600-1 through 600-n, where "n" is a natural number.

Each of the memory systems 600-1 through 600-n may be embodied by the memory system 600 illustrated in FIG. 9. The memory systems 600-1 through 600-n may form a RAID array. The data processing system 700 may be a data processing system for/within a PC, a network-attached storage (NAS) or an SSD. Each of the memory systems 600-1 through 600-n may be implemented as a memory module.

During a program operation, the RAID controller 710 may transmit data output from a host to at least one of the memory systems 600-1 through 600-n based on a RAID level in response to a program request received from the host. During a read operation, the RAID controller 710 may transmit to the host data read from at least one of the memory systems 600-1 through 600-n in response to a read command received from the host.

Figure 11:
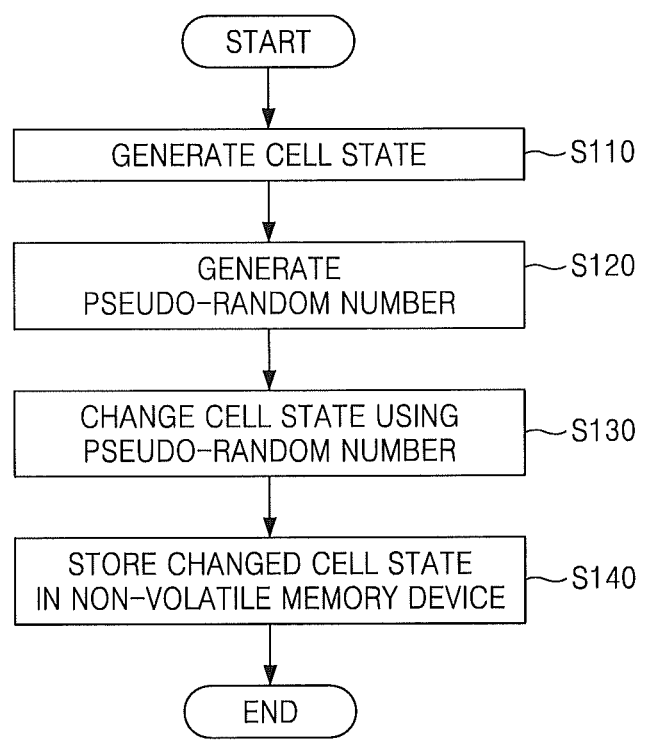
FIG. 11 is a flowchart illustrating operations of the memory controller illustrated in FIG. 1 according to various embodiments.

FIG. 11 is a flowchart illustrating operations of the memory controller 20 illustrated in FIG. 1 according to various embodiments. The control unit 33 generates the cell state Pj for each MLC 42 to which the page data PDATA is written in the non-volatile memory device 40, using the page data PDATA (S110).

The control unit 33 generates a random/pseudo-random number (e.g., a 2-bit pseudo-random number Hi) using the pseudo-random number generator 33-2 (S120). Using the random/pseudo-random number, the control unit 33 changes the cell state Pj of each MLC 42 using a hash function and outputs a changed cell state CPj (S130). The memory controller 20 may store the changed cell state CPj output from the control unit 33 in the non-volatile memory device 40 (S140).

As described herein, according to various embodiments of the present inventive concept, a memory controller and a memory system including the same can randomize cell states so that the cell states of a plurality of MLCs to which data is programmed are uniformly distributed, thereby increasing the reliability of the memory system.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A memory controller comprising:
a cell state generator configured to generate a cell state for each of a plurality of multi-level cells included in a non-volatile memory device using data of pages;
a pseudo-random number generator configured to generate a pseudo-random number; and
an operator configured to change the cell state of each multi-level cell using the pseudo-random number and the generated cell state and to output a changed cell state for each multi-level cell,
wherein the cell state for each of the plurality of multi-level cells is determined using data from at least two pages.

2. The memory controller of claim 1, wherein the operator is configured to change the cell state of each multi-level cell using a hash function.

3. The memory controller of claim 2, wherein the pseudo-random number is used as a first key value of the hash function and the cell state of each multi-level cell is used as a second key value of the hash function.

4. The memory controller of claim 2, wherein the hash function is stored in a read-only memory included in the memory controller.

5. The memory controller of claim 3, wherein the memory controller transmits data of pages that corresponds to the changed cell state to the non-volatile memory device.

6. A memory system comprising:
a non-volatile memory device including a plurality of multi-level cells; and
a memory controller configured to control an operation of the non-volatile memory device, the memory controller including a cell state generator configured to generate a cell state of each of the multi-level cells included in the non-volatile memory device using data of pages, a pseudo-random number generator configured to generate a pseudo-random number, and an operator configured to change the cell state of each multi-level cell using the pseudo-random number and the generated cell state and to output a changed cell state for each multi-level cell,
wherein the cell state for each of the plurality of multi-level cells is determined using data from at least two pages.

7. The memory system of claim 6, wherein the operator is configured to change the cell state of each multi-level cell using a hash function.

8. The memory system of claim 7, wherein the pseudo-random number is used as a first key value of the hash function and the cell state of each multi-level cell is used as a second key value of the hash function.

9. The memory system of claim 6, wherein data of pages that corresponds to the changed cell state is stored in the non-volatile memory device.

10. The memory system of claim 9, wherein the data of pages is written to a single word line in the non-volatile memory device.

11. The memory system of claim 6, wherein the memory system is a multi-chip package comprising the non-volatile memory device and the memory controller.

12. A memory card comprising:
a card interface configured to communicate with a host; and
the memory controller of claim 1 connected between the card interface and the non-volatile memory device including the plurality of multi-level cells.

13. The memory card of claim 12, wherein the memory card is one of a multimedia card (MMC), a secure digital (SD) card, and a universal serial bus (USB) flash drive.

14. A portable communication system comprising:
the memory controller of claim 1 configured to control an operation of the non-volatile memory device; and
a display configured to display data output from the non-volatile memory device under the control of the memory controller.

15. A solid state drive comprising:
the memory controller of claim 1 configured to control a data processing operation of each of a plurality of non-volatile memory devices including the non-volatile memory device; and
a buffer manager configured to control data transmitted between the memory controller and a host to be stored in a volatile memory device.

16. A memory controller comprising:
a cell state generator configured to use page data to generate multi-bit cell states for respective multi-level cells that are in a non-volatile memory device;
a pseudo-random number generator configured to generate a multi-bit pseudo-random number; and an operator including inputs connected to the cell state generator and the pseudo-random number generator, respectively, the operator configured to use the multi-bit pseudo-random number and the generated multi-bit cell states for the respective multi-level cells to change the multi-bit cell states for the multi-level cells, the operator further configured to output changed cell states for the multi-level cells to the non-volatile memory device, wherein the cell state for each of the plurality of multi-level cells is determined using data from at least two pages.

17. The memory controller of claim 16, wherein the operator is configured to use a hash function to change the multi-bit cell states, and wherein the operator uses the hash function to perform a logic operation on the multi-bit cell states using the multi-bit pseudo-random number to change the multi-bit cell states to the changed cell states.

18. The memory controller of claim 17, wherein the hash function is stored in the memory controller.

19. The memory controller of claim 16, wherein the page data comprises data received from a host that is connected to the memory controller, and wherein the memory controller is configured to connect the host to the non-volatile memory device.

20. The memory controller of claim 16, wherein;
the page data comprises first and second values from first and second pages, respectively; and
the cell state generator is configured to generate one of the multi-bit cell states using the first and second values from the first and second pages.

* * * * *